United States Patent [19]

Ushiki

[11] Patent Number: 4,979,147
[45] Date of Patent: Dec. 18, 1990

[54] ELECTRONIC DEVICE WITH KEY SWITCH

[75] Inventor: Hiroshi Ushiki, Yokohama, Japan

[73] Assignee: Kabushiki Kaisha Toshiba, Kanagawa, Japan

[21] Appl. No.: 397,331

[22] Filed: Aug. 23, 1989

Related U.S. Application Data

[63] Continuation of Ser. No. 93,787, Sep. 8, 1987, abandoned.

[30] Foreign Application Priority Data

Sep. 29, 1986 [JP] Japan .................................. 61-227981

[51] Int. Cl.$^5$ .............................................. G11C 7/00
[52] U.S. Cl. ................................. 365/189.04; 365/233
[58] Field of Search ..................... 365/189.04, 189.01, 365/189.08, 230.06, 233

[56] References Cited

U.S. PATENT DOCUMENTS 4,718,044 1/1988 Matsuyama .......................... 365/230
4,723,226 2/1988 McDonough et al. ............. 365/230

Primary Examiner—Joseph A. Popek
Attorney, Agent, or Firm—Finnegan, Henderson, Farabow, Garrett and Dunner

[57] ABSTRACT

An electronic data input device for temporary storage of the data in a random memory, includes a memory device for storing a predetermined data. The electronic data input device comprises a keyswitch device for entry of data, an input port device for receiving the entered data from the keyswitch device, and an output port device coupled to the keyswitch device for temporary storage of the predetermined data from the memory device, and transfer of the predetermined data to the keyswitch device. Means are provided for simultaneously transferring the predetermined data from the memory device to the output port device and the entered data from the input port device to the random memory.

4 Claims, 5 Drawing Sheets

ELECTRONIC DEVICE WITH KEY SWITCH

This application is a continuation of application Ser. No. 093,787, filed Sept. 8, 1987, now abandoned.

BACKGROUND OF THE INVENTION

1. Field of the Invention

This invention relates to an electronic device having keyswitches as data input devices. In particular, it relates to an electronic device which requires high-speed key-judging process in low-speed machine cycle operations.

2. Description of the Related Art

In an electronic device such as an electronic desk calculator, a keyswitch matrix typically is provided as a data input device. An example of inputting of key data using this kind of keyswitch matrix in related art is shown in FIG. 1. In the example, an output port 52 outputs data from a ROM (not shown) through a bus-line 51. Manual data are input by a keyswitch matrix 53. Input lines 54 connect the matrix to the output port 52. Output lines 55 transfer data from the matrix 54, and reference numeral 56 is an input port.

Initially, before data is input to the matrix, a setting cycle operation is carried out for preparing the device to receive data. During the setting cycle, multiple-bit data are fed to bus-line 51 from the ROM (not shown), and predetermined bit positions of the multiple-bit data read from the ROM. correspond to a level "1". These data are latched successively to output port 52 at specified intervals. The data latched to output port 52 are then fed to input line 54 in keyswitch matrix 53. Following this setting cycle, data can be input to the matrix 53. During the input or "read" cycle, the data on output line 55 of keyswitch matrix 53 are latched to input port 56 at specified intervals. These latched data are output to bus-line In this way, data corresponding to the operational state of the keyswitch matrix 53 (hereafter, key-data) connected to one of the input lines 54 can be obtained. These key-data are read after having once been stored in a memory, such as a RAM (not shown). A key-judging process then is carried out in an ALU (arithmetic logic unit)(not shown). During this process, the ALU compares the key-data with predetermined data stored in a memory to identify the key-data. Then, the above type of key-data entry operation is repeated on each input in succession.

Thus, with the structure of the related art described above, in the processing of data on bus-line 51, the entry of key-data for one input line is carried out during both the setting cycle and the "read" cycle. Therefore, the time required for entry of data is longer in an electronic device in which the setting and read cycles are set very slow. Also, in this situation, the time of the key-judging process is longer. For instance, in the case of a solar desk calculator, which uses solar cells, the basic clock signal frequency is set at a low level for low current consumption. For this reason, the number of machine cycles is greater, and the key-judging correspondingly is slower.

As described above there is a drawback in the related art device, in that the key-data entry time (the time necessary for properly entering data through one keyswitch) is too long (two machine cycles) and key-judging cannot be carried out rapidly enough.

SUMMARY OF THE INVENTION

An object of this invention is to provide an electronic device with a keyswitch which can carry out key-data entry in a short time.

Another object of the invention is to reduce the time a keyswitch must be closed to effectively input data without increasing the power consumption of the device.

Additional objects and advantages will be obvious from the description which follows or may be learned by practice of the invention.

This invention provides an electronic data input device for temporary storage of the data in a random memory, the device including a memory device for storing predetermined data. The electronic data input device comprises a keyswitch device for entry of data, an input port device for receiving the entered data from the keyswitch device, an output port device coupled to the keyswitch device for temporary storage of the predetermined data from the memory device, and transfer of the predetermined data to the keyswitch device, and a device for simultaneously transferring the predetermined data from the memory device to the output port device and the entered data from the input port device to the random memory.

In an electronic device with a keyswitch of this invention, an address which designates the memory address is fed to the output port as level-setting data for the input line of the keyswitch matrix. By this means, in one machine cycle period, the keyswitch matrix input line level-setting operation and the operation of reading data from the output line can be performed in parallel. Thus, key-data entry can be carried out in a short time.

DETAILED DESCRIPTION OF THE PREFERRED EMBODIMENT

The following is an explanation with reference to drawings of an embodiment of this invention.

Figure 1:
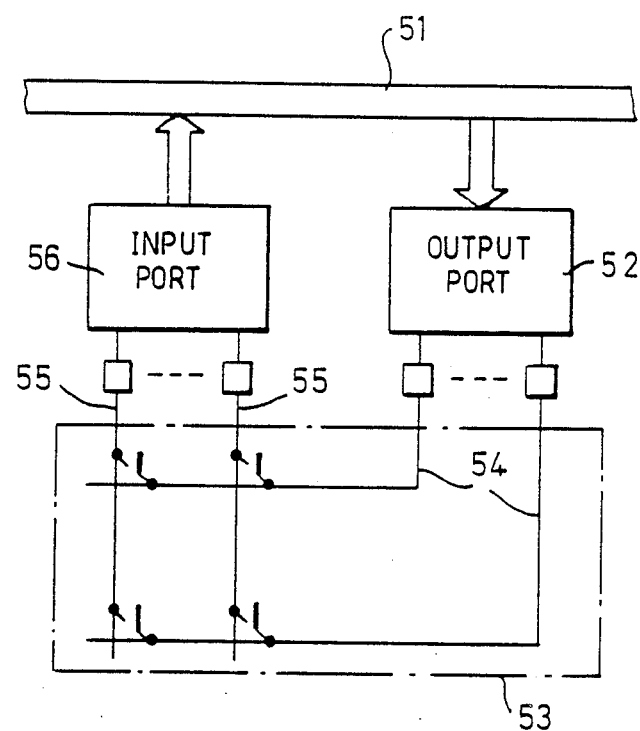
FIG. 1 is a block diagram to illustrate a related prior art device.
Figure 2:
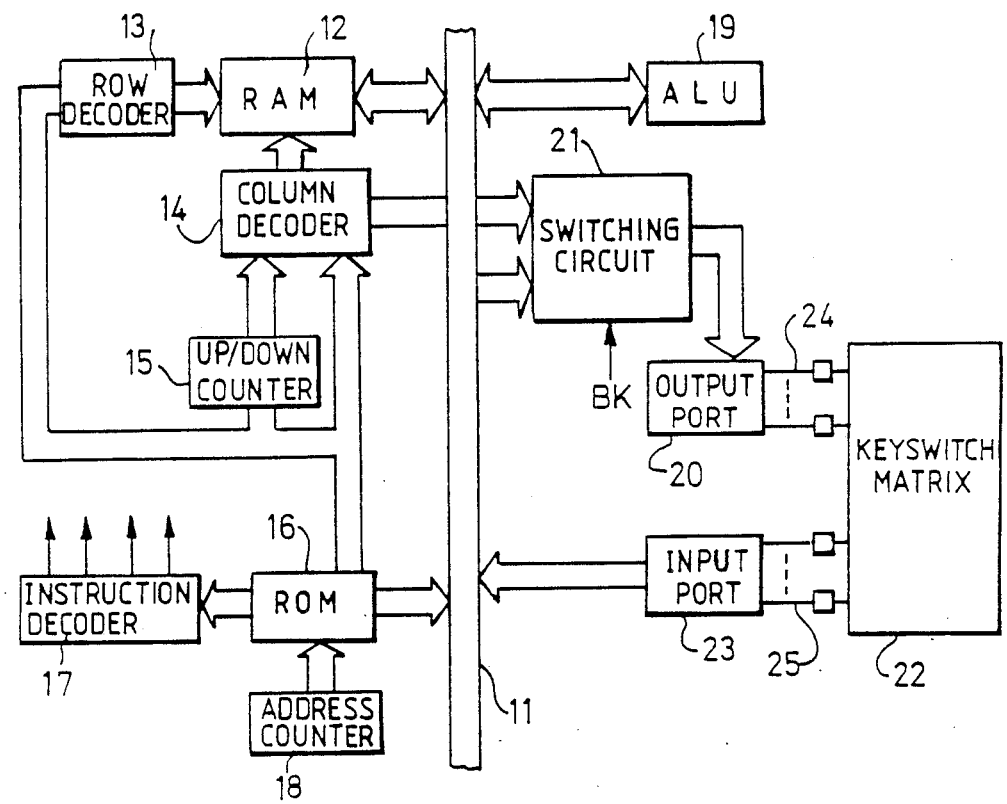
FIG. 2 is a block diagram showing the overall construction of an embodiment of this invention.

FIG. 2 is a block diagram showing the overall construction of a device of this invention. In FIG. 2, a RAM 12 (random access memory) stores data transported on a data-bus 12 and, at the same time, reads memory data and outputs it to data-bus 11. A row decoder 13 designates the address of RAM 12 in the row direction. A column decoder 14 designates the address of RAM 12 in the column direction. An up/down counter 15 feeds continuous addresses in order from the start address which has been set beforehand for column decoder 14. A ROM 16 (read-only memory) feeds addresses for row decoder 13 and column decoder 14, the start address for up/down counter 15, and generates various kinds of commands and data. An instruction decoder 17 reads the commands output from ROM 16 and generates various control signals. An address counter 18 performs address designation for ROM 16. An ALU 19 (arithmetic logic unit) performs various logic calculations such as addition and subtraction, AND, OR and exclusive OR and discrimination processes such as size comparison. An output port 20 outputs data to a keyswitch matrix 22. A switching circuit 21 is supplied with a part of the column address from column decoder 14. At the same time, the circuit 21 is supplied with data generated by ROM 16. Circuit 21 switches to supply one or the other of these inputs to output port 20 on the basis of switching signal BK. In the keyswitch matrix 22, multiple keyswitches are arranged in a matrix. Data from output port 20 are fed to keyswitch matrix 22 by input lines 24. The output line data from keyswitch matrix 22 are fed to an input port 23 by output lines 25.

In an electronic device with such a construction, data which are output from output port 20 and input to input port 23 via keyswitch matrix 22 are fed to RAM 12 via bus-line 11 and are temporarily stored in RAM 12. After this, the key-judging process is performed by ALU 19 based on the content of the data.

Figure 3:
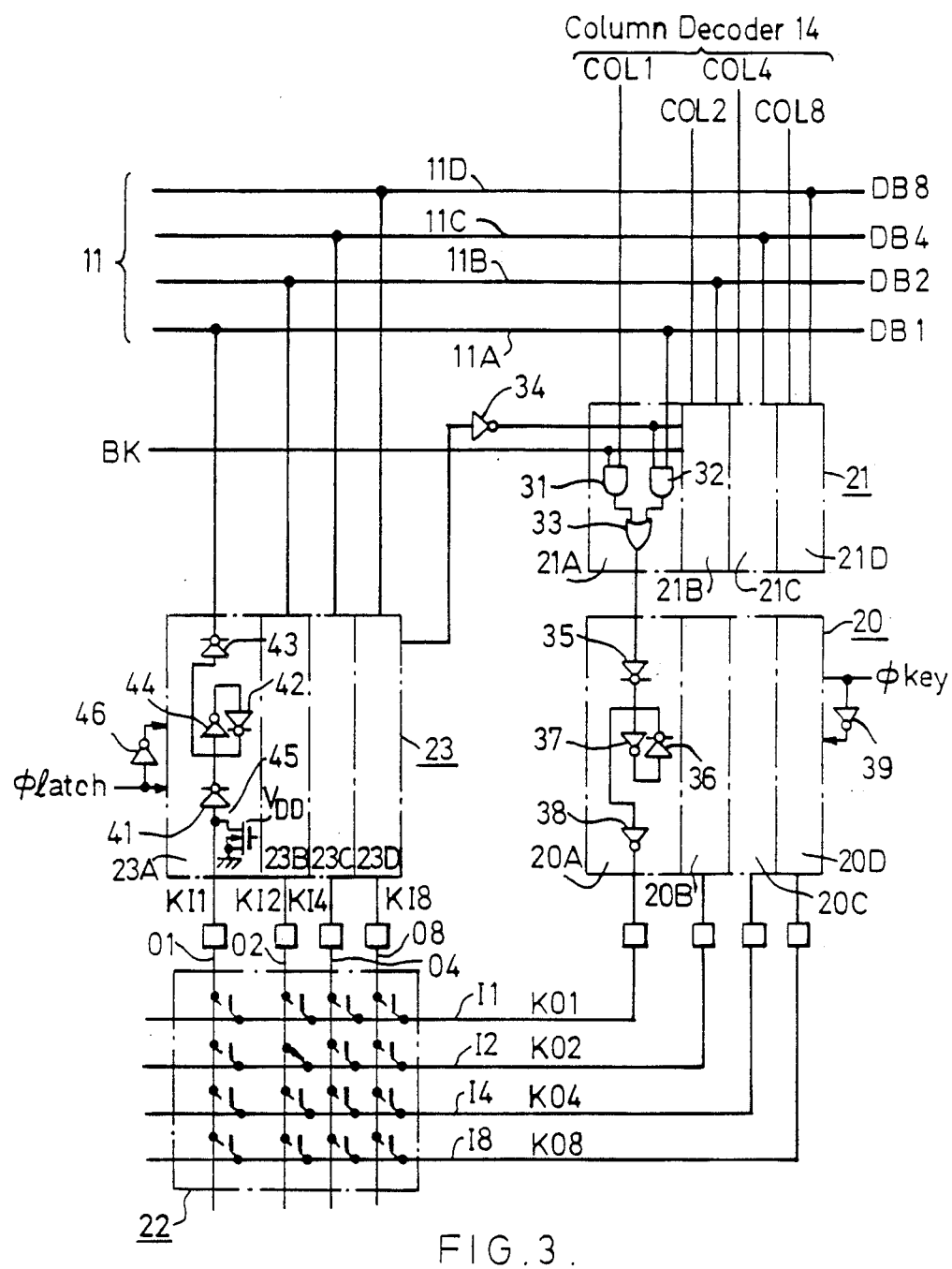
FIG. 3 is a circuit diagram showing the detail of a part of the above embodiment.

FIG. 3 is a circuit diagram showing a practical construction for the part of the embodiment which includes bus-line 11, switching circuit 21, output port 20, keyswitch matrix 22 and input port 23.

Bus-line 11 is, for example, of 4-bit construction and 4 lines 11, 11, 11 and 11 are provided.

In switching circuit 21, four switch sections 21A, 21B, 21C and 21D are provided, corresponding to the number of lines in bus-line 11. These, as represented by switch section 21A, are each composed of two AND gates 31 and 32 and an OR gate 33 to which the outputs of AND gates 31 and 32 are fed in parallel. The switching signal BK is fed directly to one of the input terminals of AND gate 31 and, via inverter 34, to one of the input terminals of AND gate 32, which are present in each switching section. Also, the address of the first digit COL1 of the column address supplied to column decoder 14 is fed to the other input terminal of AND gate 31 in switching section 21A. Data DB1 on line 11A are fed to the other input terminal of AND gate 32. In switching section 21B, the address of the second digit COL2 of the column address supplied to column decoder 14 is fed to the other input terminal of AND gate 31, while data DB2 on line 11B are fed to the other input terminal of AND gate 32. In switching section 21C, the address of the fourth digit COL4 of the column address supplied to column decoder 14 is fed to the other input terminal of AND gate 31, while data DB4 on line 11C is fed to the other input terminal of AND gate 32. In switching section 21D, the address of the eighth digit COL8 of the column address supplied to column decoder 14 is fed to the other input terminal of AND gate 31, while data DB8 on line 11D are fed to the other input terminal of AND gate 32.

Output port 20 is provided with four ports 20A, 20B, 20C and 20D corresponding to the bit numbers on bus-line 11. As represented by port 20A, these ports are each composed of two clocked inverters 35 and 36, and two inverters 37 and 38. The output of the OR gate 33 in the corresponding switching section of switching circuit 21 is fed to clocked inverter 35. Clocked inverter 35 is synchronized by control signal φ key. This input is inverted and is fed to inverter 37. The output and input terminals of clocked inverter 36 are connected to the input and output terminals of inverter 37. Control signal φ key is fed to clocked inverter 36 via inverter 39. That is to say, inverter 37 and clocked inverter 36 make up a latch circuit which latches the output of clocked in-verter 35 when control signal φ key is "0" level. The output of this latch circuit is input to inverter 38.

Keyswitch matrix 22 is provided with four input lines I2, I2, I4 and I8, and four output lines O1, O2, O4 and O8. A keyswitch K is provided at each point of intersection of an input line I and an output line O. In this example, a total of 16 keyswitches are provided. The data KO2, KO2, KO4 and KO8 output from each port of output port 20 are fed to the four input lines I1, I2, I4 and I8, respectively.

Input 23 is also provided with four ports 23A, 23B, 23C and 23D corresponding to the bit numbers on bus-line 11. These, as represented by port 23A, are each composed of three clocked inverters 41, 42 and 43, one inverter 44 and an N-channel MOS transistor 45. Data KO1, KO2, KO4 and KO8 on keyswitch matrix 22 is outputted to lines O1, O2, O4 and O8. This data is fed to each respective clocked inverter 41. Also, each clocked inverter 41 is synchronized by control signal φ latch. Each inverter 41 inverts the input and feeds it to an inverter 44. The output and input terminals of clocked inverter 42 are connected to the input and output terminals of inverter 44. The control signal φ latch is fed to clocked inverter 42 via inverter 46. That is to say, when control signal φ latch is "0" level, inverter 44 and clocked inverter 42 form a latch circuit which latches the output of clocked inverter 41. Moreover, the output of this latch circuit is input to clocked inverter 43, which is controlled by signal BK. The output data from clocked inverter 43 is to the corresponding line on bus-line 11. Each N-channel MOS transistor 45 is connected between the input terminal of a clocked inverter 41 and ground potential. They are normally in the ON state and prevent the input terminal of clocked inverter 41 from becoming floating.

Next, the operation of a device with the above construction will be explained.

Figure 4:
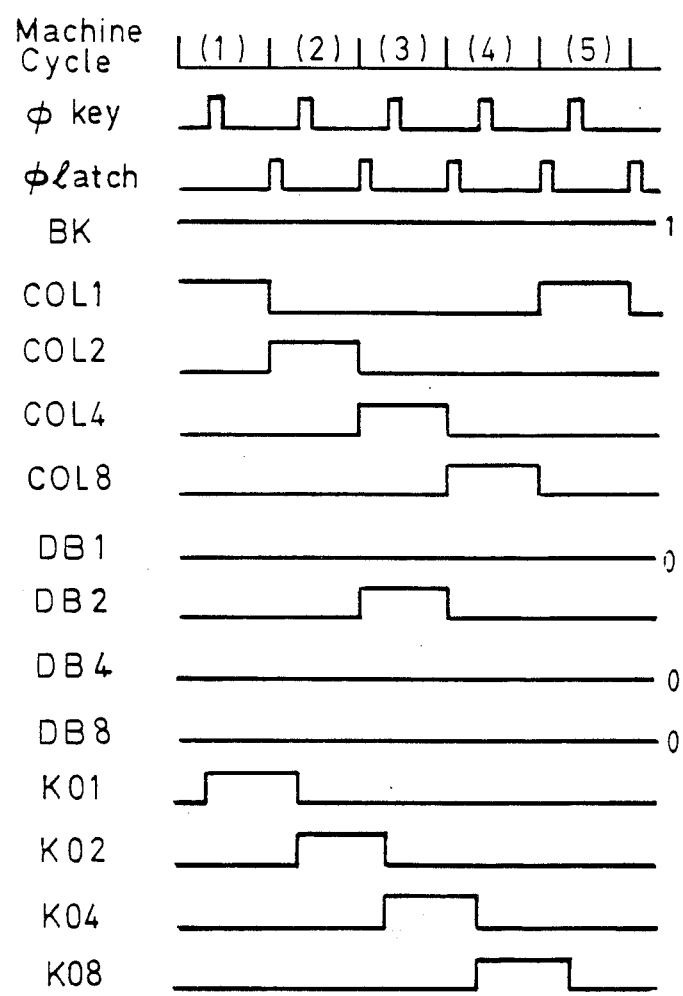
FIGS. 4 and 5 are timing charts showing the operation of the above embodiment.

FIG. 4 is a timing chart which shows the operation when key-data entry is carried out for a short period. In this case, switching signal BK is fixed at "1" level. At this time, one of the AND gates in each of switching sections 21A, 21B, 21C and 21D in switch circuit 21 is open. Switching circuit 21 switches the data COL1, COL2, COL4 and COL8 from column decoder 14 and outputs these to output port 20.

First, the first machine cycle (1) is called the initial pattern setting cycle. This cycle is set so that the pattern of the four bits of output data KO1, KO2, KO4 and KO8 from output port 20 are arranged in a prescribed pattern. That is to say, each of the clocked inverters 85 in ports 20A, 20B, 20C and 20D of output port 20 operates when control signal φ key becomes "1" level. The column addresses COL1, COL2, COL4 and COL8, Which are respectively "1" level, "0" level, "0" level, from column decoder 14 are inverted and fed to each latch circuit. As a result, after control signal φ key has become a "1" level the output data KO1, KO2, KO4 and KO8 from each port 20A, 20B, 20C and 20D are set at "1", "0", "0" and '0'. In this case, only input line I1 of keyswitch matrix 22 is "1" level, and the other input lines I2, I4 and I8 are all "0" level. If at this time all the keyswitches K connected to input line I1, which has been set at "1" level, were not operated and were not closed, the "1" level data would not be transmitted to the four output lines O1, O2, O4 and O8. The input terminals of each clocked inverter 41 in ports 23A, 23B, 23C and 23D of input port 23 would be set to "0" level by each of the transistors 45.

The four machine cycles (2) to (5) after machine cycle (1) are each called key input reading cycles. At the beginning of machine cycle (2), first. control signal φ latch becomes "1" level. This causes each clocked inverter 41 in ports 23A, 23B, 23C and 23D of input port 23 to operate and the data on output lines O1, O2, O4 and O8 of keyswitch matrix 22 are inverted. As a result, after control signal φ latch has become "1" level, the output data from each port 23A, 23B. 23C and 23D are all made "0" level and these data are output on to bus-line 11 as DB1, DB2, DB4 and DB8. After this, these data are fed to RAM 12 as data for storage via bus-line 11. However, in this machine cycle (2), column address COL1, which is output from column decoder 14, is changed from "1" level to "0" level and, at the same time, column address COL2 is changed from "0" level to "1" level. As a result, the data input to input port 23 and fed to RAM 12 via bus-line 11 are stored at an address in RAM 12 which corresponds to column address COL2 being "1" level.

Moreover, in this machine cycle (2), the column addresses COL1, COL2, COL4 and COL8 are respectively "0"level, "1" level, "0" level and "0" level. Consequently, after control signal φ key has become "1" level, output data KO1, KO2, KO4 and KO8 from each port 20A, 20B, 20C and 20D of output port 20 are set, respectively, at "0", "1", "0" and "0" levels. In this case, only input line I2 of keyswitch matrix 22 becomes "1" level and the other input lines I1, I4 and I8 all become "1" level. If at this time, the output of the keyswitches K which are connected to input line I2 set at "1"level, the keyswitch connected to the point of intersection with output line O2 is operated, "1"level data will be transmitted only to that output line O2.

At the beginning of the next machine cycle (3), because control signal φ latch is "1" level, out of the output data from each port 23A, 23B, 23C and 23D, only 23 is made "1"level, while the remainder are made "0" level. These are fed to bus-line 11 as DB1, DB2, DB4 and DB8. After this, these data are fed to RAM I2 as data for storage via bus-line 11.

In this machine cycle (3). column address COL4, which is output from column decoder 14, is changed to "1" level Therefore, the data fed to RAM 12 via bus-line 11 are fed to an address in RAM 12 corresponding to column address COL4 being "1" level.

Thereafter, in machine cycles (4) and (5), data corresponding to the operating state of keyswitches K, which are connected, respectively, to input lines I4 and I8 of keyswitch matrix 22, are input to input port 23. These data are successively stored at addresses in RAM 12 corresponding to address column COL8 being "1" level and to address column COL1 being "1" level.

In this way, the entry of key-data for a keyswitch matrix 22 having four input lines is completed in five machine cycles, including initial pattern setting cycle (1). However, in the related art devices, two machine cycles were required for entering key-data on one input line, and so eight machine cycles were required for entering key-data on four input lines. Consequently, when using the above embodiment, which has a keyswitch matrix 22 with four input lines, the entry time for key-data can be shortened by as much as three machine cycles compared with the related art devices. This means that, compared with the related art devices, the more keyswitches there are, the more the effect is increased. For example, in the case of five input lines, when 25 keyswitches are provided, ten machine cycles would be required for entering key-data in the related art device, but in the above embodiment, six machine cycles would suffice. For this reason, a great reduction in the key-judging processing time, which includes the entry of key-data can be achieved.

Figure 5:
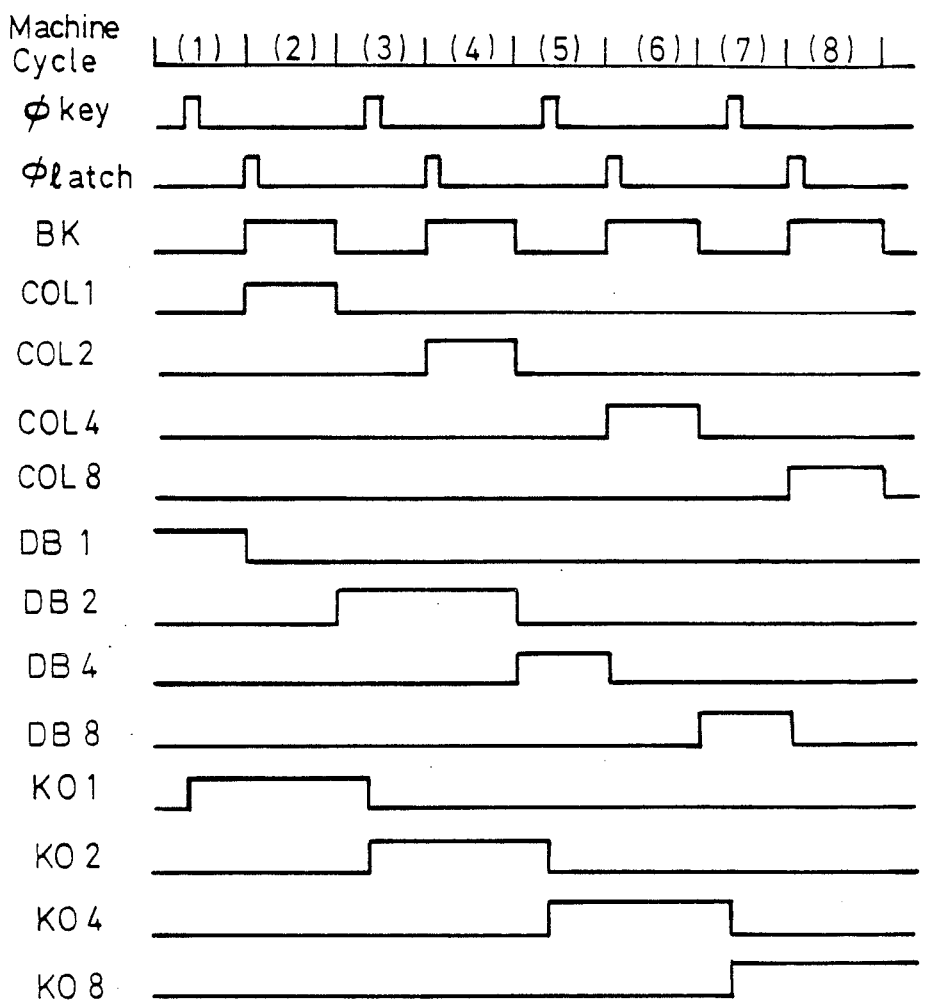

Moreover, in the above embodiment, for entering key-data, it is possible, as in the related art devices, to read data from ROM 16, output them onto bus-line 11 and feed these data to output port 20 via switching circuit 21. Next, the operation at such a time is explained with reference to the timing chart in FIG. 5. In this case, switching signal BK is set at "0" level when data are output from bus-line 11 to output port 20, and at "1" level when data are output from input port 23 to bus-line 11.

First, switching signal BK is set to "0" to level in the first machine cycle (1). At this time, the other AND gates 32 in each of the switching sections 21A, 218, 21C and 21D of switching circuit 21 open, and switching circuit 21 switches data DB1, DB2, DB4 and DB8 on bus-line 11 and outputs them to output port 20. ROM 16 outputs the data so that only DB1 is "1" level and the rest are all "0" level.

Next, when control signal φ key is "1" level, each clocked inverterer 35 in ports 20A, 20B, 20C and 20D of output port 20 operates, and data DB1, DB2, DB4 and DB8 from switching circuit 21 are inverted and fed to each latch circuit. After this, they are inverted by each inverter 38 and output to each input line I of keyswitch matrix 22. At this time only line I1 is set at "1" level.

In the next machine cycle (2), switching signal BK is set at "1" level. By this means bus-line 11 and output port 20 are separated from each other and data on bus-line 11 are prevented from being fed to output port 20. On the other hand, when control signal φ becomes "1" level at the beginning of machine cycle (2), the levels of the four output lines O1, O2, O4 and O8 are set in accordance with the states of all the keyswitches K connected to input line I1 which is set at "1" level. In this case, if none of the keyswitches is operated, all the output data from each port 23A, 23B. 23C and 23D of input port 23 will be made "0" level and these data will be output to bus-line 11 as DB1, DB2, DB4 and DB8. At this time, column addresses COL1, COL2, COL4 and COL8 will be made "1" level, "0" level, "0" level and "" level. For this reason, the data output on bus-line 11 will be fed to RAM 12. After that, column address COL1 will be stored at an address in RAM 12 corresponding to "1" level.

Thereafter, in the same way, in the first cycle of a pair of machine cycles, data are read from ROM 16 and output to bus-line 11. These data are fed to output port 20 via switching circuit 21. In the second cycle of the pair, the data input to output port 23 are output to bus line 11. Thus, it is possible to perform the entry of key-data in two machine cycles in the same way as in the related art devices. Also, in this case, instead of the data from ROM 16 being fed to output port 20, by making the addresses differ for reading and writing, it is possible to feed data read from RAM 12 to input port 20 and to store data which has passed through keyswitch matrix 22 in RAM 12.

When using this invention in the manner described above, an electronic device having a keyswitch which can perform the entry of key-data in a short time can be provided.

Various modifications and variations could be made to the invention without departing from the scope of the invention.

What is claimed is:

1. An electronic data input device for temporary storage of the input data in a random memory, the device including memory means for storing predetermined data, comprising:
   keyswitch means for entry of data;
   input port means for receiving the entered data from the keyswitch means;
   output port means coupled to the keyswitch means for temporary storage of the predetermined data from the memory means and transfer of the predetermined data to the keyswitch means; and
   means for simultaneously transferring the predetermined data from the memory means to the output port means and the entered data from the input port means to the random memory.

2. The device of claim 1 wherein the simultaneous transfer means includes bus-line means connected to the input port means for transferring the entered data from the input port means to the random memory, and means for by-passing the bus-line means and transferring the predetermined data from the memory means to the output port means.

3. The device of claim 2 wherein the by-passing means includes decoding means for receiving the predetermined data from the memory means and transferring the predetermined data to the output port means without access to the bus-line means.

4. The device of claim 3 wherein the by-passing means also is connected to the memory means and the output port means and the device also includes means for switching between a first position wherein the predetermined data is transferred from the memory means to the output port means by the by-passing means and a second position wherein the predetermined data is transferred from memory means to the output port means by the bus-line means.

* * * * *

UNITED STATES PATENT AND TRADEMARK OFFICE
CERTIFICATE OF CORRECTION

PATENT NO. : 4,979,147
DATED : December 18, 1990
INVENTOR(S) : Hiroshi Ushiki

It is certified that error appears in the above-identified patent and that said Letters Patent is hereby corrected as shown below:

In the title: change "KEY SWITCH" to --KEYSWITCH--.

Claim 1, column 7, line 6, change "of the input data" to --of input data--.

Signed and Sealed this

Sixteenth Day of March, 1993

*Attest:*

STEPHEN G. KUNIN

*Attesting Officer*     Acting Commissioner of Patents and Trademarks